United States Patent [19]

Martin et al.

[11] Patent Number: 4,724,021

[45] Date of Patent: Feb. 9, 1988

[54] METHOD FOR MAKING POROUS BOTTOM-LAYER DIELECTRIC COMPOSITE STRUCTURE

[75] Inventors: Paul J. Martin, Gloucester City, N.J.; Thomas E. Dueber, Wilmington, Del.

[73] Assignee: E. I. Du Pont de Nemours and Company, Wilmington, Del.

[21] Appl. No.: 888,567

[22] Filed: Jul. 23, 1986

[51] Int. Cl.$^4$ ............... B32B 18/00; B32B 31/26
[52] U.S. Cl. .................... 156/89; 501/18; 501/20; 501/138; 501/139
[58] Field of Search ............ 156/89; 501/18, 20, 501/2, 134, 135, 136, 137, 138, 139; 427/118, 126.2; 428/318.4, 318.6

[56] References Cited

U.S. PATENT DOCUMENTS

| | | | |
|---|---|---|---|
| 3,673,092 | 6/1972 | Dietz | 501/18 |
| 3,788,997 | 1/1974 | MacKenzie | 501/18 |
| 3,926,702 | 12/1975 | Oki et al. | 156/89 |
| 4,010,133 | 3/1977 | Nakayama | 501/139 |
| 4,055,451 | 10/1977 | Cockbain et al. | 156/89 |
| 4,481,261 | 11/1984 | Johnson et al. | 501/20 |

*Primary Examiner*—Caleb Weston

[57] ABSTRACT

A method for inhibiting the formation of blisters during the firing of intermediate layers of fired multilayer electronic components comprising the sequential steps of:

(1) applying to a substrate a first and second layer of finely divided particles of dielectric solids and glass dispersed in organic medium; and (2) firing the layers to effect volatilization of the organic medium therefrom, liquid phase sintering of the glass components and densification of both layers, the softening point of the glass, the particle size of the glass and the ratio of glass to dielectric solids in both layers being adjusted in such manner that when the layers are fired, the first layer is porous and the second layer is nonporous.

9 Claims, No Drawings

METHOD FOR MAKING POROUS BOTTOM-LAYER DIELECTRIC COMPOSITE STRUCTURE

FIELD OF INVENTION

This invention relates to a smooth, hermetic, substantially blister-free dielectric in a ceramic hybrid multilayer circuit, and in particular to a dielectric structure which inhibits dielectric and copper blistering in ceramic hybrid multilayer circuits.

BACKGROUND OF THE INVENTION

Multilayer ceramic thick film circuits have been used for many years to increase circuit functionality per unit of area. Heretofore, most of the dielectric materials used in multilayer circuits have been conventional monolithic thick film dielectric compositions. These are comprised of finely divided particles of dielectric solids and inorganic binders dispersed in an organic medium. Such thick film materials are usually applied by screen printing, though they may be applied by other means as well. Thick film materials of this type are very important and will continue to be so.

However, recent advances in circuit technology have placed new demands on dielectric materials for this use in that the drive towards finer resolution and higher reliability has placed a premium on smooth, blister-free dielectric surfaces with good hermeticity. Such surfaces would accept fine-resolution thick-film or thin-film conductor lines with a much lower probability of circuit "opens" or circuit "shorts" to other conductor levels. In turn, thick-film conductor lines should not blister upon the further refiring needed to complete the thick-film multilayer, as this loss of adhesion dramatically reduces circuit reliability.

Dielectric blistering can occur upon initial firing of a hermetic, monolithic dielectric layer, especially over copper conductor. Historically, dielectric blistering has been eliminated by compromising the hermeticity of the dielectric layer. On the other hand, conductor blistering, especially copper blistering, occurs upon either initial firing or subsequent refiring of copper over a hermetic, monolithic dielectric layer. Copper blistering can occur even if the copper is buried under subsequent dielectric layers. Once again, the historical solution to copper blistering has been to compromise the hermeticity of the underlying dielectric layer, raising the possibility of short circuits developing through the dielectric layer with time.

It appears that dielectric blistering is primarily caused by premature sintering of the dielectric layer upon initial firing which traps gas generated at the interface between the dielectric layer and the underlying copper layer. On the other hand, it appears that copper blistering is primarily caused by diffusion of glass from the dielectric up into the copper metallization upon refiring. This glass seals over the copper metallization, which leads to copper blistering.

Notwithstanding the effectiveness of the prior art processes for applying a monolithic layer of ceramic dielectric, in many applications there is a strongly unmet need for blister-free ceramic dielectric layers which can be applied by either conventional methods, such as screen printing, or as a laminated film where more exacting properties are required.

SUMMARY OF THE INVENTION

In its primary aspect the invention is directed to a method for inhibiting the formation of blisters during the firing of intermediate layers of fired multilayer electronic components comprising the sequential steps of:

(1) applying to a substrate a first layer of finely divided particles of dielectric solids and glass dispersed in organic medium;

(2) applying to the first dispersion layer a second layer comprising finely divided particles of glass dispersed in organic medium and (3) firing the layers to effect volatilization of the organic medium therefrom, liquid phase sintering of the glass components and densification of both layers, the softening point of the glass, the particle size of the glass and the ratio of glass to dielectric solids in both layers being adjusted in such manner that when the layers are fired, the sintering of the glass in the layers is such that upon completion of firing both layers, the first layer is porous and the second layer is nonporous, as measured by the Ink Adsorption Test.

In another aspect, the invention is directed to a multilayer composite structure comprising (1) a substrate having adherent thereto (2) a first dispersion layer of finely divided particles of dielectric solids and glass dispersed in organic medium, the first dispersion layer having adherent thereto (3) a second dispersion layer of finely divided particles of dielectric solids and glass dispersed in organic medium, which layers have been fired to effect volatilization of the organic medium therefrom and liquid phase sintering of the glass, the softening point of the glass, the particle size of the glass and the ratio of glass to dielectric solids in both layers being adjusted in such manner that when the layers are fired, the sintering of the glass in the layers in such that the first layer is porous and the second layer is nonporous, as measured by the Ink Adsorption Test.

In a further aspect, the invention is directed to multilayer composite structure comprised of a plurality of such two layer dielectric composites alternating with patterned electroconductive layers.

DETAILED DESCRIPTION OF THE INVENTION

A. Ceramic Solids

The invention is applicable to virtually any high melting inorganic solid material. However, it is particularly suitable for making dispersions of dielectric solids such as alumina, titanates, zirconates and stannates. It is also applicable to precursors of such materials, i.e., solid materials which upon firing are converted to such dielectric solids, and to mixtures of any of these.

Among the many dielectric solids which are likely to be used in the invention are $BaTiO_3$, $CaTiO_3$, $SrTiO_3$, $PbTiO_3$, $CaZrO_3$, $BaZrO_3$, $CaSnO_3$, $BaSnO_3$, and $Al_2O_3$. As will be apparent to those skilled in the ceramic arts, the exact chemical composition of the ceramic solids to be used in the composition of the invention is not ordinarily critical in the rheological sense. However, it is preferred that the ceramic solids not have swelling characteristics in the organic dispersion since the rheological properties of the dispersion may be substantially changed thereby.

It has been found that the dispersions of the invention must contain no significant amount of solids having a particle size of less than 0.3 $\mu m$ in order to obtain adequately complete burnout of the organic medium when the films or layers thereof are fired to remove the organic medium and to effect sintering of the inorganic binder. However, none of the ceramic solids may exceed 20 μm and, furthermore, at least 75 wt. % of the ceramic solids must have a size of 1–10 μm. When the dispersions are used to make thick film pastes, which are usually applied by screen printing, the maximum particle size must not exceed the thickness of the screen, and when the dispersion is used to make dry film, the maximum particle size must not exceed the thickness of the film.

In addition, it is preferred that surface area/weight ratio of the ceramic particles not exceed 10 m$^2$/g for the reason that such particles tend to affect adversely the sintering characteristics of the accompanying inorganic binder. It is still further preferred that the surface area/weight ratio not exceed 5 m$^2$/g. Ceramic particles having a surface area/weight ratio of 1–5 have been found to be quite satisfactory.

B. Inorganic Binder

The glass frit used in the present invention aids in sintering the inorganic crystalline particulates and may be of any well known composition which has a melting temperature below that of the ceramic solids. Nevertheless, in order to get adequate hermeticity of the devices, it is preferred that the glass transition temperature ($T_g$) of the inorganic binder be 550°–825° C. and still more preferably 575°–750° C. If melting takes place below 550° C., organic material will likely be encapsulated and blisters will tend to form in the dielectric layer as the organics decompose. On the other hand, a glass transition temperature above 825° C. will tend to produce a porous dielectric when sintering temperatures compatible with copper metallizations, e.g., 900° C., are used.

The glass frits preferably used are the vitrifying borosilicate frits, such as lead borosilicate frit, and bismuth, cadmium, barium, calcium or other alkaline earth borosilicate frits. The preparation of such glass frits is well known and consists, for example, in melting together the constituents of the glass in the form of the oxides of the constituents and pouring such molten composition into water to form the frit. The batch ingredients may, of course, be any precursor compound that will yield the desired oxides under the usual conditions of frit production. For example, boric oxide will be obtained from boric acid, silicon dioxide will be produced from flint, barium oxide will be produced from barium carbonate, etc.

The glasses are prepared by conventional glassmaking techniques, by mixing the desired components in the desired proportions and heating the mixture to form a melt. As is well known in the art, heating is conducted to a peak temperature and for a time such that the melt becomes entirely liquid and homogeneous. In the present work, the components are premixed by shaking in a polyethylene jar with plastic balls and then melted in a platinum crucible at the desired temperature. The melt is heated at the peak temperature for a period of 1 to 1½ hours. The melt is then poured into cold water. The maximum temperature of the water during quenching is kept as low as possible by increasing the water-to-melt ratio. The crude frit after separation from water is freed of residual water by drying in air or displacing the water by rinsing with methanol. The crude frit is then ball milled for 3–5 hours in alumina containers using alumina balls. Alumina contamination of the frit is not within the observable limit of x-ray diffraction analysis.

After discharging the milled-frit slurry from the mill, excess solvent is removed by decantation and the frit powder is air dried at room temperature. The dried powder is then screened through a 325-mesh screen to remove any large particles. The inorganic binder, like the ceramic solids, should have a surface-to-weight ratio of no more than 10 m$^2$/g and at least 75 wt. % of the particles should have a particle size of 0.3–10 μm.

It is preferred that the 50% point of the inorganic binder, which is defined as equal parts by weight of both larger and smaller particles, be equal to or less than that of the ceramic solids. Sintering rate is related directly to the ratio of inorganic binder to ceramic solids and inversely to $T_g$ and particle size of the inorganic binder. The accessible variables for adjusting the hermeticity of a dielectric layer include, but are not limited to, (1) inorganic binder/ceramic solids ratio, (2) glass transition temperature of the inorganic binder, (3) particle size, and (4) firing temperature.

C. Organic Polymeric Binder

As set out hereinabove, the binder component of the dispersion of the invention is an organic polymeric binder selected from the group consisting of (1) homopolymers and copolymers of $C_{1-10}$ alkyl acrylates, $C_{1-10}$ alkyl methacrylates, alpha-methylstyrene and 0–2 wt. % ethylenically unsaturated carboxylic acid, amine or silane-containing compounds, (2) homopolymers and copolymers of $C_{1-10}$ mono-olefins, (3) homopolymers and copolymers of $C_{1-4}$ alkylene oxide and mixtures thereof, the binder comprising 5–25 wt. % basis total inorganic solids.

The above-described polymers include homopolymers as well as random copolymers and higher multipolymers. The relative quantity of carboxylic acid or amine distributed along the polymer chains should be no more than 2.0 wt. %. Because they are cleaner burning in low oxygen atmospheres, methacrylic polymers, especially poly(methyl methacrylate), are preferred over acrylic polymers.

It is preferred that the comonomers containing functional moieties not exceed 10.0 wt. % of any one polymer or 2.0% in the polymer mixture to avoid flocculation of the dispersed ceramic solids. In some instances, it has been observed that polymer mixtures having as low as 1.8% acid-containing monomers may be borderline or even unsatisfactory with respect to dispersion characteristics. In most instances of this kind, such polymers can, nevertheless, still be used in the invention by employing a more polar solvent. Thus, while a polymer mixture containing as much as 2.0% monomer-containing functional groups can be used, such polymer mixtures having only 1.5% functional monomers are preferred. No more than 1.0 wt. % of such functional monomers is still further preferred. It is also preferred for the same reason that none of the polymers contained in the polymeric mixture contain more than 10.0 wt. % functional comonomer. Thus, the polymeric binder can be a mixture of polymers, some of which contain no functional moieties at all and some of which contain as much as 10.0 wt. % functional comonomers so long as the content of functional comonomers in the total mixture is within the range of 0.2–2.0 wt. %. On the other hand, it is preferred that the polymeric binder be comprised mostly of methacrylic polymers as defined above which contain 0–5.0 wt. % functional comonomer.

Suitable copolymerizable carboxylic acids include ethylenically unsaturated $C_{3-6}$ monocarboxylic acids such as acrylic, methacrylic and crotonic acids and $C_{4-10}$ dicarboxylic acids such as fumaric, itaconic, citaconic, vinyl succinic and maleic acids as well as their half esters and, where appropriate, their anhydrides and mixtures thereof. Because they are cleaner burning in low-oxygen atmospheres, methacrylic polymers are preferred over acrylic polymers.

It is, of course, recognized that certain amine constituents cannot be incorporated in the chain directly by copolymerization of the amine-containing monomer but may be incorporated indirectly by postpolymerization reaction of a pendant reactive moiety of the polymer chain. Illustrative of this are primary amines which can be added by reaction of glycidyl compounds with pendant carboxylic acid groups in the presence of ammonia. Thus, as used herein, the term "ethylenically unsaturated amine" is intended to include polymers derived from both amine-containing comonomers as well as other comonomers which have been postpolymerizationally reacted to form amine groups thereon. Primary, secondary and tertiary amines are each effective in a similar manner. Suitable comonomers for direct incorporation of pendant amine groups into the binder polymer chain include diethylaminoethyl methacrylate, dimethylaminoethyl methacrylate and t-butylaminoethyl methacrylate. Suitable comonomers which yield pendant functional moieties suitable for postpolymerization reaction to incorporate amine functionality include the above-described ethylenically unsaturated viz. epoxides such as glycidyl acrylate or glycidyl methacrylate.

Within the above-described limits for the nonacidic comonomers, it is preferred that the alkyl acrylate or methacrylate constitute at least 75 and preferably 80 wt. % of the polymer.

The polymeric binder can contain up to about 10 wt. % of other nonacrylic and nonacidic comonomers such as styrene, acrylonitrile, vinyl acetate, acrylamide and the like, so long as the previously discussed compositional criteria are met as well as the physical criteria mentioned below. However, it is preferred to use not more than about 5 wt. % of such monomers because they are more difficult to burn out cleanly. At present, the use of such other comonomers is not known to add to the efficacy of the copolymers in their application to the invention. However, such comonomers in the above-listed amounts do not detract from the effectiveness of the polymers so long as all the compositional and physical property criteria are met.

In addition to the above described acrylic and methacrylic polymers, various polyolefins such as polyethylene, polypropylene, polybutylene, polyisobutylene, and ethylene-propylene copolymer can also be used. Also useful in the invention are the so-called polyethers which are polymers of lower alkylene oxides, such as polyethylene oxide, polypropylene oxide and polybutylene oxide, and cellulose ethers.

In addition to the above-described compositional parameters, certain physical properties of the polymeric binder are, of course, important. In particular, it will be recognized by those skilled in the photoresist art that the plasticized unexposed binder polymer must be substantially developable in whatever solvent developer is used. On the other hand, the photohardened binder must have sufficient solvent resistance that it is not washed off by the developer solvent.

Polymers meeting these criteria can be made by those skilled in the art of acrylate polymerization by conventional solution polymerization techniques. Typically, such acidic acrylate polymers are prepared by combining an alpha, beta-ethylenically unsaturated acid with one or more copolymerizable vinyl monomers in a relatively low boiling (75°–150° C.) organic solvent to obtain a 20 to 60% solution of the monomer mixture, then subsequently causing the monomers to polymerize by the addition of a polymerization catalyst and heating the mixture at the reflux temperature of the solution at atmospheric pressure. After the polymerization reaction is essentially complete, the resulting acid polymer solution is cooled to room temperature and samples are removed to determine the viscosity, molecular weight, acid equivalent, etc. of the polymer.

D. Photoinitiation System

Suitable photoinitiation systems are those which are thermally inactive but which generate free radicals upon exposure to actinic light at or below 185° C. These include the substituted or unsubstituted polynuclear quinones which are compounds having two intracyclic carbon atoms in a conjugated carbocyclic ring system, e.g., 9,10-anthraquinone, 2-methylanthraquinone, 2-ethylanthraquinone, 2-tert-butylanthraquinone, octamethylanthraquinone, 1,4-naphthoquinone, 9,10-phenanthrenequinone, benz(a)anthracene-7,12-dione, 2,3-naphthacene-5,12-dione, 2-methyl-1,4-naphthoquinone, 1,4-dimethyl-anthraquinone, 2,3-dimethylanthraquinone, 2-phenylanthraquinone, 2,3-diphenylanthraquinone, retenequinone, 7,8,9,10-tetrahydronaphthacene-5,12-dione, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols such as benzoin, pivaloin, acyloin ethers, e.g., benzoin methyl and ethyl ethers, benzil dimethyl ketal; α-hydrocarbon-substituted aromatic acyloins, including α-methylbenzoin, α-allylbenzoin and α-phenylbenzoin. Photoreducible dyes and reducing agents disclosed in U.S. Pat. Nos. 2,850,445, 2,875,047, 3,097,096, 3,074,974, 3,097,097, and 3,145,104, as well as dyes of the phenazine, oxazine, and quinone classes, Michler's ketone, benzophenone, 2,4,5-triphenylimidazolyl dimers with hydrogen donors including leuco dyes and mixtures thereof as described in U.S. Pat. Nos. 3,427,161, 3,479,185, and 3,549,367 can be used as initiators. Also useful with photoinitiators and photoinhibitors are sensitizers disclosed in U.S. Pat. No. 4,162,162. The photoinitiator or photoinitiator system is present in 0.05 to 10% by weight based on the total weight of the dry photopolymerizable layer.

E. Photohardenable Monomer

The photohardenable monomer component of the invention is comprised of at least one addition polymerizable ethylenically unsaturated compound having at least one polymerizable ethylenic group. Such compounds are capable of forming a high polymer by free radical initiated, chain propagating addition polymerization. Preferably, the unsaturated compound (monomer) has at least two terminal ethylenically unsaturated groups, e.g., 2 to 4 groups. The monomeric compounds are nongaseous. That is, they have a normal boiling point above 100° C. and a plasticizing action on the organic polymeric binder.

Suitable monomers which can be used alone or in combination with other monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di-(p-hydroxyphenyl)propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Particularly preferred monomers are polyoxyethylated trimethylolpropane triacrylate, ethylated pentaerythritol triacrylate, dipentaerythritol monohydroxypentaacrylate and 1,10-decanediol dimethylacrylate. The unsaturated monomeric component is present in an amount of 5 to 45% by weight based on the total weight of the dry photopolymerizable layer.

Minor amounts of other components can be present in the photopolymerizable compositions, e.g., pigments, dyes, thermal polymerization inhibitors, adhesion promoters, such as organosilane coupling agents, plasticizers, coating aids such as polyethylene oxides, etc. so long as the photopolymerizable compositions retain their essential properties.

F. Organic Medium

The main purpose of the organic medium is to serve as a vehicle for dispersion of the finely divided solids of the composition in such form that it can readily be applied to a ceramic or other substrate. Thus, the organic medium must first be one in which the solids are dispersible with an adequate degree of stability. Secondly, the rheological properties of the organic medium must be such that they lend good application properties to the dispersion.

When the dispersion is to be made into a film, the organic medium in which the ceramic solids and inorganic binder are dispersed consists of the above-described polymeric binder, monomer and initiator which are dissolved in a volatile organic solvent and, optionally, other dissolved materials such as plasticizers, release agents, dispersing agents, stripping agents, antifouling agents and wetting agents.

The solvent component of the organic medium, which may be a mixture of solvents, is chosen so as to obtain complete solution therein of the polymer and to be of sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include benzene, acetone, xylene, methanol, ethanol, methylethyl ketone, 1,1,1-trichloroethane, tetrachloroethylene, amyl acetate, 2,2,4-triethyl pentanediol-1,3-mono-isobutyrate, toluene, methylene chloride, and ethylene glycol monoalkyl and dialkyl ethers such as ethylene glycol mono-n-propyl ether. For casing films, methylene chloride is particularly preferred because of its volatility.

Frequently the organic medium will also contain one or more plasticizers which serve to lower the $T_g$ of the binder polymer. Such plasticizers help to assure good lamination to ceramic substrates and enhance the developability of unexposed areas of the composition. However, the use of such materials is preferably minimized to reduce the amount of organic materials which must be removed when the films cast therefrom are fired. The choice of plasticizers is, of course, determined primarily by the polymer which must be modified. Among the plasticizers which have been used in various binder systems are diethyl phthalate, dibutyl phthalate, butyl benzyl phthalate, dibenzyl phthalate, alkyl phosphates, polyalkylene glycols, glycerol, poly(ethylene oxides), hydroxy ethylated alkyl phenol, tricresyl phosphate, triethyleneglycol diacetate and polyester plasticizers. Dibutyl phthalate is frequently used in acrylic polymer systems because it can be used effectively in relatively small concentrations.

The photosensitive compositions of the invention will frequently be employed as the photosensitive layer of a resist element in which the photosensitive layer is coated upon a support film.

In conventional photoresist elements, it is necessary, or at least highly desirable, to protect the photosensitive layer by a removable coversheet in order to prevent blocking between the photosensitive layer and the reverse surface of the support when they are stored in roll form. It is also desirable to protect the layer laminated to a substrate by means of the removable support film during imaging exposure to prevent blocking between the layer and the phototool.

The photopolymerizable composition is coated upon the support film at a dry coating thickness of about 0.0004 inch (~0.0010 cm) to about 0.01 inch (~0.025 cm) or more. A suitable strippable support which preferably has a high degree of dimensional stability to temperature changes may be chosen from a wide variety of films composed of high polymers, e.g., polyamides, polyolefins, polyesters, vinyl polymers, and cellulose esters and may have a thickness of from 0.0005 inch (~0.0013 cm) to 0.008 inch (~0.02 cm) or more. If exposure is to be made before removing the strippable support, it must, of course, transmit a substantial fraction of the actinic radiation incident upon it. If the strippable support is removed prior to exposure, no such restrictions apply. A particularly suitable support is transparent polyethylene terephthalate film having a thickness of about 0.001 inch (~0.0025 cm).

When an element contains no removable, protective coversheet and is to be stored in roll form, the reverse side of the strippable support preferably has applied thereto a thin release layer of a material such as wax or silicone to prevent blocking with the photopolymerizable stratum. Alternatively, adhesion to the coated photopolymerizable layer may be preferentially increased by flame treating or electrical discharge treating the support surface to be coated.

Suitable removable, protective coversheets when used may be chosen from the same group of high polymer films described above and may have the same wide range of thicknesses. A coversheet of 0.001 inch (~0.0025 cm) thick polyethylene is especially suitable. Supports and coversheets as described above provide good protection to the photopolymerizable resist layer during storage prior to use.

It is preferred that the weight ratio of the inorganic solids (dielectric and glass) to organics be within the range of 2.0 to 8.0 and, more preferably, from 2.6 to 4.5. A ratio of no more than 8.0 is necessary to obtain adequate dispersion and rheological properties. However, below 2.5, the amount of organics which must be burned off is excessive and the quality of the final layers suffers. The ratio of inorganic solids to organics is dependent on the particle size of the inorganic solids, the organic components and on surface pretreatment of the inorganic solids. When the particles are treated with organosilane coupling agents, the ratio of inorganic solids to organics can be increased. It is preferred to use a lower level of organics to minimize firing defects. It is especially important that the ratio of inorganics to organics be as high as possible.

On the other hand, when the dispersion is to be applied as a thick film paste, conventional thick film organic media can be used with appropriate rheological adjustments and the use of lower volatility solvents.

When the compositions of the invention are formulated as thick film compositions, they will usually be applied to a substrate by means of screen printing. Therefore, they must have appropriate viscosity so that they can be passed through the screen readily. In addition, they should be thixotropic in order that they set up rapidly after being screened, thereby giving good resolution. While the rheological properties are of primary importance, the organic medium is preferably formulated also to give appropriate wettability of the solids and the substrate, good drying rate, dried film strength sufficient to withstand rough handling and good firing properties. Satisfactory appearance of the fired composition is also important.

In view of all these criteria, a wide variety of inert liquids can be used as organic media. The organic medium for most thick film compositions is typically a solution of resin in a solvent and, frequently, a solvent solution containing both resin and thixotropic agent. The solvent usually boils within the range of 130°–350° C.

Especially suitable resins for this purpose are polymethacrylates of lower alcohols and monobutyl ether of ethylene glycol monoacetate.

The most widely used solvents for thick film applications are terpenes such as alpha- or beta-terpineol or mixtures thereof with other solvents such as kerosene, dibutylphthalate, butyl carbitol, butyl Carbitol acetate, hexamethylene glycol and high boiling alcohols and alcohol esters. Various combinations of these and other solvents are formulated to obtain the desired viscosity and volatility requirements for each application.

Among the thixotropic agents which are commonly used are hydrogenated castor oil and derivatives thereof. It is, of course, not always necessary to incorporate a thixotropic agent since the solvent/resin properties coupled with the shear thinning inherent in any suspension may alone be suitable in this regard.

The ratio of organic medium to inorganic solids in the dispersions can vary considerably and depends upon the manner in which the dispersion is to be applied and the kind of organic medium used. Normally, to achieve good coverage, the dispersions will contain complementally by weight 60–90% solids and 40–10% organic medium. Such dispersions are usually of semifluid consistency and are referred to commonly as "pastes".

The pastes are conveniently prepared on a three-roll mill. The viscosity of the pastes is typically within the following ranges when measured at room temperature on Brookfield viscometers at low, moderate and high shear rates:

| Shear Rate (Sec$^{-1}$) | Viscosity (Pa.s) | |
| --- | --- | --- |
| 0.2 | 100–5000 | — |
|  | 300–2000 | Preferred |
|  | 600–1500 | Most preferred |
| 4 | 40–400 | — |
|  | 100–250 | Preferred |
|  | 140–200 | Most preferred |
| 384 | 7–40 | — |
|  | 10–25 | Preferred |
|  | 12–18 | Most preferred |

The amount and type of organic medium (vehicle) utilized is determined mainly by the final desired formulation viscosity and print thickness.

In the case of photosensitive materials, various dyes and pigments may also be added to increase visibility of the photo image. Any colorant used, however, should preferably be transparent to the actinic radiation used, although it may be opaque to or strongly absorb other radiation in the visible or UV spectral region.

In addition to the many parameters of properties and composition described above, it is essential that all of the components—both inorganic and organic—be substantially free of halogens. The reason for this is that under normal firing conditions, halogenated compounds cause corrosion of adjoining conductive layers as well as the surfaces of the furnace in which they are fired.

G. Relationship Between The Underlying And Overlying Layers

The proper functioning of the invention requires that the underlying and overlying layers in the dielectric structure be properly related with respect to porosity.

When fired individually on a 96.5% alumina substrate, the underlying layer must be porous. However, the overlying layer must be nonporous, or hermetic under like firing conditions. In addition, the structure may have one or more intermediate layers which can be either porous or nonporous. The intermediate layers can be comprised of glass particles alone or they may also contain particles of ceramic solids as well. The composition of the glass and/or ceramic solids in the intermediate layers may be the same or different than the composition of the adjoining layers. The preferred test for determining the relative porosity of an individually fired dielectric layer is the Ink Adsorption Test which is described hereinbelow.

The gradient-porosity dielectric structure inhibits dielectric blistering by facilitating the venting of gas generated at the dielectric-underlying copper interface during the first firing of the dielectric structure. Generally once the dielectric is fired, it is sufficiently rigid to resist blistering on refire. To prevent dielectric blistering the underlying porous layer can be relatively thin, with the preferred range being 0.20 to 2 times the thickness of the overlying hermetic layer. The overlying layer can contain up to 100% inorganic binder to give an extremely hermetic dielectric structure overall.

The invention inhibits copper blistering by retarding diffusion of the inorganic binder into the overlying copper. Copper is sufficiently ductile to blister on refire. To prevent copper blistering it is preferred that the underlying layer be 0.20 to 2 times the thickness of the overlying layer. The overlying dielectric layer should only contain sufficient inorganic binder to bring the overall dielectric structure into the preferred range of hermeticity. A method of measuring the hermeticity of the overall dielectric structure is the Wet Dissipation Factor test (the Wet DF test).

A particularly preferred composition and therefore best mode for practicing invention is one in which the first and second dielectric layers have the following compositions:

First Layer (a) finely divided particles of ceramic solids having a surface area-to-weight ratio of no more than 10 m$^2$/g and at least 75 wt. % of the particles having a size of 0.5–10 micron, and (b) finely divided particles of inorganic binder having a glass transition temperature of 550°–825° C., a surface area-to-weight ratio of no more than 10 m$^2$/g and at least 75 wt. % of the particles having a size of 0.3–10 micron, the volume % of (b) being 30%–70% of total inorganic solids, and (c) an organic binder selected from the group consisting of (1) homopolymers and copolymers of $C_{1-10}$ alkyl acrylates, $C_{1-10}$ alkyl methacrylates, alpha methylstyrene and 0–2 wt. % ethylenically unsaturated carboxylic acid, (2) homopolymers and copolymers of $C_{1-10}$ mono-olefins, (3) homopolymers and copolymers of $C_{1-4}$ alkylene oxide (4) cellulose ethers, and admixtures thereof, the organic binder comprising 1–25 wt. % on the basis of total inorganic solids.

Second Layer

The overlying coating composition consists essentially of (a) finely divided particles of ceramic solids having a surface area-to-weight ratio of no more than 10 m$^2$/g and at least 75 wt. % of the particles having a size of 0.5–10 micron, and (b) finely divided particles of inorganic binder having a glass transition temperature of 550°–825° C., a surface area-to-weight ratio of no more than 10 m$^2$/g and at least 75 wt. % of the particles having a size of 0.3–10 micron, the volume % of (b) being 50%–100% of total inorganic solids, and (c) an organic binder selected from the group consisting of (1) homopolymers and copolymers of $C_{1-10}$ alkyl acrylates, $C_{1-10}$ alkyl methacrylates, alpha methylstyrene and 0–2 wt. % ethylenically unsaturated carboxylic acid, (2) homopolymers and copolymers of $C_{1-10}$ mono-olefins, (3) homopolymers and copolymers of $C_{1-4}$ alkylene oxide (4) cellulose ethers, and admixtures thereof, the organic binder comprising 1–25 wt. % on the basis of total inorganic solids.

The underlying layer is distinguished from the overlying layer in that the underlying layer, if individually fired onto a 96.5% alumina substrate, will absorb and retain ink in the Ink Adsorption Test, while the individually fired overlying layer will not.

H. Test Procedures

Ink Adsorption

The Ink Adsorption Test is carried out as follows. The test piece is held horizontally. A drop of nonsmear rubber-stamp blue ink (Ranger Products Company, Red Bank, NJ) is placed on the dielectric surface and allowed to stand 30 seconds. The test part is then held vertically in a stream of cold tap water for 30 seconds, followed by a stream of acetone for 15 seconds, in the attempt to wash off the ink. Areas of ink retention which are traceable to distinct defects, such as blisters or dirt, should be ignored. If there is no visible ink retention on the dielectric surface, the dielectric is deemed nonporous. If there is visible ink retention on the dielectric surface, the dielectric is deemed porous.

Capacitance, Dry Dissipation Factor (DF), and Wet Dissipation Factor (Wet DF)

A capacitor is formed from the dielectric structure comprising (a) a copper disk having an area of 1 cm$^2$ and a contact tab supported on an alumina substrate, (b) a gradient-porosity dielectric structure overlying the copper disk but leaving the contact tab exposed, and (c) a second copper disk of the same size overlying the dielectric structure and having a contact tab rotated 90–180 degrees with respect to the lower tab.

Capacitance and dry DF are measured at 1 kHz using a Hewlett-Packard HP4274A multi-frequency LCR meter. The thickness of the dielectric is measured with a Sloan Dektak IIA Profilometer. It may alternately be measured on a light-section microscope or on an SEM photograph of a sectioned capacitor. All capacitors are held at least 15 hours after firing before making electrical measurements. It is common that the dissipation factor (DF) decreases by 0.5–2% within this holding time period. However, capacitance is generally unaffected during this period.

The dielectric constant is calculated using the equation:

$$K=(C/A) \cdot t$$

where

C is the capacitance of the capacitor

A—is the area of small electrode in contact with the dielectric layer t—is the thickness of the dielectric layer.

Wet DF is determined by placing a drop of water on the upper copper disk so that it wets the disk but not the contact tab. After standing for 30 seconds, DF is determined in the usual manner. The dielectric is considered to be hermetic when the wet DF is less than 1%. Below 0.5% is preferred.

Insulation Resistance (IR)

Insulation resistance is measured using Super megohm meter Model RM 170 (Biddle Instruments, AVO, Ltd., U.K.). Insulation resistance measurements are made after charging the capacitor with 100 VDC. Each number is the average of at least 10 measurements.

Breakdown Voltage

The Breakdown Voltage test (also called the dielectric-strength test) consists of the application of a voltage higher than rated voltage for a specific time between mutually insulated portions of a component part or between insulated portions and ground. This is used to observe whether the component part can operate safely at its rated voltage and withstand momentary overpotentials due to switching, surges, and other similar phenomena. Although this test is often called a voltage breakdown or dielectric-strength test, it is not intended that this test cause insulation breakdown or that it be used for detecting corona. Rather it serves to determine whether insulating materials and spacings in the component part are adequate. When a component part is faulty in these respects, application of the test voltage will result in either disruptive discharge or deterioration. Disruptive discharge is evidenced by flashover (surface discharge), sparkover (air discharge), or breakdown (puncture discharge). Deterioration due to excessive leakage currents may change electrical parameters or physical characteristics. Dielectric breakdown is reported in volts/mil or volts/cm of dielectric thickness. Dielectric layers are designed to have sufficient thickness to provide a margin of safety well below the breakdown of the electric. The test is conducted in accordance with MIL-STD-202E, 16 April 1973.

Electromigration Resistance (EMR)

The leakage current determined in the electro migration resistance (EMR) test empirically measures the cross-sectional area of open porosity in the dielectric which is permeated by electrolyte. Screen printed conductor patterns of 9924 thick film copper are made with a 6.25 cm² area with a tab extending from this square to the edge of the 2"×2" alumina substrate. After the parts are fired, the dielectric is applied over this except for the tab at the edge of the part. After this is fired, the parts are tested within a period of 18 to 24 hours. The test parts are mounted vertically in stirred 1N sodium chloride so that the 6.25 cm² pattern is immersed. A platinum anode is also immersed in the electrolyte and an electric field of 10 volts DC is applied across the part which is inserted into a prewired connector. The current flow through the part is maintained for 5 minutes and the leakage current is recorded from a multi-range microammeter wired in series with the test piece.

Measurement of Glass $T_g$ $T_g$ is determined from the linear thermal expansion curve of the premelted frit as measured by ASTM designation C 372-81, "Linear Thermal Expansion of Porcelain Enamel and Glaze Frits and Fired Ceramic Whiteware Products by the Dilatometer Method".

EXAMPLES

Component Materials

In the examples which are set out below, the following component materials were used having the indicated properties:

A. Inorganics
Glass frit A: Ferro[1] glass #3467 ball milled in water, fractionated and dried to give a surface area of 1.3–2.2 m²/g and a particle size distribution of
90% point 8.9–10 μm
50% point 5.1–5.8 μm
10% point 2.4–2.8 μm
Composition (component mole %): lead oxide (5.6), silicon dioxide (68.1), boron oxide (4.7), alumina (6.5), calcium oxide (11.1), sodium oxide (2.8) and potassium oxide (1.3).

Glass frit B: Ferro[1] glass #3467 with a surface area of 3.1–4.9 m²/g and a particle size distribution of
90% point 4.2 μm
50% point 2.1 μm
10% point 0.8 μm
Composition the same as glass frit A.

Glass frit C: Ferro[1] glass #3467 ball milled in water, fractionated and dried to give a surface area of 3.9–4.6 m²/g and a particle size distribution of
90% point 3.0–4.0 μm
50% point 2.1–2.7 μm
10% point 1.1–1.3 μm
Composition the same as glass frit A.

Glass frit D: Glass having a particle size distribution of
90% point 12.0 μm
50% point 5.6 μm
10% point 1.7 μm
Composition (component mole %): magnesium oxide (4.0) silicon dioxide (39.8), boron oxide (4.7), alumina (7.8), calcium oxide (8.5), titanium dioxide (10.0), zinc oxide (11.8), and barium oxide (13.5).

Alumina A: Alcoa A-14 aluminum oxide ($Al_2O_3$) with a surface area ranging from 3.0 to 4.5 m²/g and a particle size distribution of
90% point 3.5–4.0 μm
50% point 2.0–2.5 μm
10% point 0.8–1.3 μm Alumina B: Alcoa A-14 aluminum oxide ($Al_2O_3$) ball milled in water with pH adjusted to 4.0 using acetic acid, fractionated and dried to give a surface area ranging from 1.0 to 2.1 m²/g and a particle size distribution of
90% point 4.7–7.6 μm
50% point 3.0–4.9 μm
10% point 1.5–2.7 μm Alumina C: Alcoa A-14 aluminum oxide ($Al_2O_3$) ball milled in water with pH adjusted to 4.0 using acetic acid, fractionated and dried to give a surface area of 2.9 m²/g and a particle size distribution of
90% point 3.8 μm
50% point 2.6 μm
10% point 1.9 μm Alumina D: Alcoa A-14 aluminum oxide ($Al_2O_3$) ball milled in water with pH adjusted to 4.0 using acetic acid, fractionated and dried to give a surface area ranging from 1.4 to 1.7 m²/g and a particle size distribution of
90% point 5.9–6.2 μm
50% point 4.0–4.4 μm
10% point 2.2–2.7 μm Alumina E: Showa AL-45-A aluminum oxide ($Al_2O_3$) with a surface area of 3.1 m²g and a particle size distribution of
90% point 2.5 μm
50% point 1.0 μm
10% point 0.4 μm Pigment: Cobalt aluminate ($CoAl_2O_4$).

B. Polymeric Binders

Copolymer of 98% methylmethacrylate, 2% methacrylic acid $M_w$ = 25 M,

-continued

|  |  |
|---|---|
|  | acid No. 9, inherent viscosity* 0.183 ± 0.011, $T_g = 106°$ C. Copolymer of 95.5% methylmethacrylate, 4.5% ethyl acrylate, $M_w = 50$ M, $T_g = 96°$ C., inherent viscosity 0.399 ± 0.011 |

(*) Inherent viscosity of a solution that contains 0.25 g polymer in 50 ml of methylene chloride measured at 20° C. using a No. 50 Cannon-Fenske viscometer.

C. Monomers

|  |  |
|---|---|
| TEOTA 1000: | Polyoxyethylated trimethylolpropane triacrylate; $M_w = 1162$ |
| Chemlink[2] 176: | Ethylated pentaerythritol triacrylate (Sartomer); $M_w = 326$ |

D. Plasticizers

|  |  |
|---|---|
| Dibutylphthalate Santicizer[3] 261 | Alkyl Benzyl Phthalate |

E. Initiators

|  |  |
|---|---|
| Michler's ketone: | 4,4'-bis-N,N—dimethylaminobenzophenone |
| Benzophenone Irgacure[4] 651: | benzil dimethylketal |

F. Others

Resolution and Exposure Latitude Improvement
Di-t-butylmethane nitroso dimer

|  |  |
|---|---|
| Antioxidant Ionol[5]; | 2,6-di-t-butyl-4-methylphenol |
| Coating Aid Polyox[6] WSRN-3000 | Polyethylene oxide; $M_w = 200$ M |

Preparation of Dielectric Films

A. Preparation of Mill Base

All of the ceramic components, glass frit, alumina, pigment and any other inorganic material are mixed with copolymer of methylmethacrylate/methacrylic acid (98/2) and/or AB dispersant combined with methylene chloride. The mixture is ball milled in a mill jar half-filled with burundum (alumina) cylinders 0.5 inch (1.27 cm) in both diameter and length for 4 to 16 hours. The dispersion is filtered through a 325-mesh screen or a 20 μm depth filter. The filtered dispersion is stirred or jar-rolled until coated.

B. Preparation of Coating Dispersion

The percent solids is determined in order to calculate the amount of other components to be added. After all the additional components are put in solution, excess solvent is removed by mechanically stirring the dispersion in a vented area and allowing solvent to evaporate until a viscosity of 700-900 cps, is reached as determined with a Brookfield viscometer using a #6 spindle at 40 rpm. The dispersion is filtered through a 325-mesh screen.

C. Coating Procedure

The dispersion is extrusion-die or knife coated onto a polyethylene terephthalate film support. The film is passed through an air impingement heater at 95°-175° F. (35°-79° C.) before it is wound up with a polyethylene coversheet.

D. Process Conditions

Care is taken to avoid dirt contamination in the process of preparing coating compositions and in preparing dielectric parts since such contamination can lead to defects in the fired dielectric. The process work is preferably done in a class-100 clean room. The film is laminated to degreased alumina parts that contain a fired conductor pattern. The parts are degreased ultrasonically in Chlorothene (1,1,1-trichloroethane) and baked in a vacuum oven at 50°-100° C. to remove the degreasing solvent. The film is laminated with a vacuum laminator, or hot-roll laminator, manufactured by Western Magnum Co., Hermosa Beach, CA with rolls covered with neoprene rubber having a Durometer rating of 50 when heated to the lamination temperature of 100°-110° C. The Durometer rating is an arbitrary scale which denotes resistance to penetration. The film is laminated to the part at a speed of 0.5-1.0 ft (15.2-30.5 cm)/min. More than one pass through the laminator can be used to assure better adhesion and conformation around copper metallizations.

The parts are exposed with a collimated HTG[7] UV exposure source after a 60-sec nitrogen purge or vacuum draw-down. The optimum exposure time is determined from an exposure series that indicates the best exposure to yield the correct size vias or photoformed holes in the dielectric after development.

The exposed parts are developed using a spin developer using a 6-8 sec, 50 psi spray of chlorothene developer with the part spinning at 2500 rpm, followed by a 2-10 sec air stream at 50 psi to dry the part. The developer is sprayed perpendicular to the spinning part. A flat-spray jet pattern was obtained with a 0.125 in (0.318 cm) JJ air atomizing nozzle from Spraying Systems Co., Wheaton, IL with setup J23 as described in Industrial Catalog 27. The solvent flow may be 50 to 2000 mL/min, preferably 300 mL/min. The nozzle-to-part distance may be 0.5 in (1.27 cm) to 8 in (20.35 cm) with a typical distance being 1.5 in (3.81 cm).

The developed parts are dried in a forced draft oven at 75° C. for 15 min and fired in a furnace with peak temperature of 900° C. to 950° C. over a two-hour cycle. In firing the composition of the invention, they are exposed to a substantially nonoxidizing atmosphere up to the glass transition temperature of the inorganic binder and to an essentially completely nonoxidizing atmosphere during the sintering phase of the firing step.

By the term "substantially nonoxidizing atmosphere" is meant an atmosphere which contains insufficient oxygen to effect any significant oxidation of copper metal, but which nevertheless contains sufficient oxygen to effect oxidation of the organic materials. In practice, it has been found that a nitrogen atmosphere of 100-1000 ppm $O_2$ is appropriate in the presintering phase of the firing step. From 300 to 800 ppm $O_2$ is preferred. The amount of oxygen is increased as the thickness of the dielectric layer increases. For one layer of dielectric film that fires out to 25 μm, 100 to 400 ppm $O_2$ is sufficient. For two layers of dielectric film that fires out to 50 μm, 200 to 800 ppm $O_2$ is preferred. On the other hand, the essentially completely nonoxidizing atmosphere used during the glass sintering step of the firing step refers to a nitrogen atmosphere containing only residual amounts of $O_2$, e.g., about 10 ppm. It is preferred to fire the composition of the invention at low heating rates in order to minimize physical defects in the fired layer.

The fired parts are tested for hermeticity by determining the wet dissipation factor (DF) by application of water on top of capacitors made therefrom. The capacitance (K) in picofarads is measured and the relative dielectric constant is calculated. The capacitors are comprised of an underlying copper metallization, 40-50 μm thick fired dielectric, and an overlying copper metallization.

The complete dielectric structure can be obtained by firing the underlying and overlying layers individually, or by cofiring the complete structure. A top layer film optimized for less light absorption than the bottom layer can be used so that adequate light penetration through the bottom layer is obtained. This allows formation of vias with vertical sidewalls. Alternatively, the first layer of dielectric can be exposed but not developed before the second layer is laminated thereon. Then, after the second layer is laminated and exposed, both layers are developed simultaneously.

Using the above-described components and procedures four different photosensitive dielectric films were prepared having the compositions indicated in Table 1 below:

TABLE 1

Composition and Properties of Films

| Film Designation | A | B | C | D |
|---|---|---|---|---|
| Mill Base | | (g) | | |
| Glass Frit A | 231.43 | 75.0 | 231.43 | 216 |
| Alumina A | 128.57 | 50 | 128.57 | 144 |
| Cobalt aluminate | 0.34 | 0.12 | 0.34 | 0.34 |
| Copolymer of 98/2 methylmethacrylate/ methacrylic acid ($M_w$ = 25 M; $T_g$ 105° C., acid #9) | 17.3 | 6 | 17.3 | 17.3 |
| Methylene chloride | 230.5 | 80 | 230.5 | 230.5 |
| Glass/alumina, ratio, wt. | 1.8 | 1.5 | 1.8 | 1.5 |
| Dry Film | | (wt. %) | | |
| Glass Frit A | 47.64 | 44.46 | 47.64 | 44.46 |
| Alumina A | 26.46 | 29.64 | 26.46 | 29.64 |
| Cobalt aluminate | 0.07 | 0.07 | 0.07 | 0.07 |
| Copolymer in Dispersion | 13.43 | 13.43 | 12.43 | 13.43 |
| Dibutylphthalate | 5.75 | 5.75 | 5.75 | 5.75 |
| Ethylated pentaerythritol triacrylate | 5.75 | 5.75 | — | — |
| Polyoxyethylated trimethylol propane triacrylate | — | — | 5.75 | 5.75 |
| Benzophenone | 0.75 | 0.75 | 0.75 | 0.75 |
| Michler's ketone | 0.05 | 0.05 | 0.05 | 0.05 |
| Di-t-butylnitroso methane dimer | 0.10 | 0.10 | 0.10 | 00.10 |
| Benzil dimethyl ketal | — | — | 1.00 | — |

Films 1 through 4 were 1.8 mils (45.7 μm) thick unfired, and 1 mil (25.4 μm) thick fired.

EXAMPLES 1 AND 2

Examples 1 and 2 illustrate the difference in adsorption properties between a porous and a nonporous layer.

In Example 1, Film A was laminated to a degreased, 3"×3" 96.5% alumina substrate, exposed overall, developed, and fired. For Example 2, Film B was laminated to a degreased, 3"×3" alumina substrate, exposed overall, developed, and fired. Process conditions used for the fabrication procedure were as follows:
  Lamination: Substrates preheated to 105° C., 110° C. roll-lamination at 0.5 ft/min
  Exposure: 60 sec. exposure in HTG[(7)] exposure unit
  Development: 1,1,1-trichloroethane sprayed on part spinning at 2500 rpm for 6 sec. followed by a 2 sec. air stream for drying
  Oven drying: 75° C. for 15 min
  Firing: Nitrogen belt furnace with less than 1000 ppm oxygen: peak temperature 900° C., 2 hr. cycle. Gas flow was 315 cu ft/hr.
The fired film of Example 1 did not visibly adsorb ink, indicating a low degree of porosity. The fired film of Example 2 adsorbed ink, indicating a high degree of porosity.

EXAMPLES 3 AND 4

Example 3 illustrates a dielectric formed from a porous layer over a nonporous layer. Example 4 illustrates a dielectric formed from a nonporous layer over a porous layer. The performance of the two dielectric structures is compared.

For Example 3, a multilayer structure was fabricated on a degreased, 3"×3" 96.5% alumina substrate by laminating, exposing overall, developing and firing Film A; laminating, exposing overall, developing and firing Film B; and laminating, imagewise exposing, developing and firing a photosensitive conductive copper film composition.

For Example 4, a multilayer structure was fabricated on a degreased, 3"×3" 96.5% alumina substrate by laminating, exposing overall, developing and firing Film B; laminating, exposing overall, developing and firing Film A; and laminating, imagewise exposing, developing and firing a photosensitive conductive copper film composition.

The processes for applying Films A and B are as given in Examples 1 and 2.

The composition of the photosensitive conductive copper film composition is given in Example 6 of U.S. patent application Ser. No. 685,028, filed Dec. 21, 1984, now U.S. Pat. No. 4,598,037, by J. J. Felten. Lamination, exposure, development and drying conditions are the same as for Films A and B. The copper composition was fired under the same conditions as Films A and B, with the exception that the oxygen content of the furnace atmosphere was reduced to less than 500 ppm. The copper image covered about 30% of the dielectric surface; this image consisted of a variety of lines and squares.

No blistering of the copper metallization was present upon either multilayer upon completion. However, after four refires the multilayer of Example 3 with the nonporous bottom layer showed more than 25 copper blisters. The multilayer of Example 4, with the porous bottom layer, had no copper blisters after 10 refires.

EXAMPLE 5

Example 5 demonstrates that the electrical performance of the dielectric structure does not degrade with refiring.

Films A and B were fabricated into four capacitors by laminating, imagewise-exposing, developing, drying and firing Film B atop a copper conductive metallization; laminating, imagewise-exposing, developing, drying and firing Film A atop the fired Film B; and imaging and firing upper conductor copper metallization.

The processes for applying Films A and B are as given in Examples 1 and 2. The processes for applying the upper and lower conductors are as given in Examples 3 and 4.

Upon completion, no copper nor dielectric blistering appeared in any capacitor. Upon eight refires, no copper nor dielectric blistering appeared in any capacitor.

Upon completion, the highest wet DF of any capacitor was 0.4%, with the average wet DF being 0.25%. Upon eight refires to 900° C. in a substantially nitrogen atmosphere, each of the four capacitors had a wet DF of 0.2%.

EXAMPLE 6

Example 6 illustrates that structures with numerous layers can be fabricated without blisters. Example 6 also illustrates that the invention operates with various conductor elements.

A ten-layer structure was fabricated on a 1"×1" 96.5% alumina substrate by this method. Copper was applied and fired overall. The following sequence of steps was then repeated three times to complete the multilayer: laminate and fire Film D overall, laminate and fire Film C overall, apply and fire copper metallization overall.

Dielectric lamination conditions were as in Examples 1 and 2. There was no exposure nor development. Firing conditions for the dielectric were as in Examples 1 and 2. The first and third conductor layers were photosensitive conductive copper film composition, laminated and fired as described in Examples 3 and 4. The second and fourth conductor layers were screen-printed copper paste composition, fired to 900° C. in a belt furnace with a nitrogen atmosphere containing less than 10 ppm oxygen.

Neither copper blistering nor dielectric blistering appeared in any layer of the multilayer structure.

EXAMPLES 7 AND 8

These examples show the utility of a thin, porous bottom layer in preventing blisters from occurring in the fired dielectric.

TABLE 2

Composition and Properties of Dielectric Films

| Film Designation | E | F |
|---|---|---|
| Mill Base | (g) | |
| Glass frit B[1] (f2857) | 1708 | 51.47 |
| Alumina A[1,2] (I2529) | 1552 | — |
| Alumina B[1,2] (I2528 settled) | — | 73.53 |
| Cobalt aluminate | 3.08 | 0.12 |
| Du Pont Elvacite[8] AB Dispersant (RCSF-5123)[3] | | |
| $\overline{M}_w = 10,400$ | | |
| $\overline{M}_N = 5,600$ | | |
| 13.76% by weight in 8 to 1 methylene chloride/toluene | 640.5 | — |
| 59.04% by weight in toluene | — | 5.72 |
| Methylene chloride | 1275 | 80.0 |
| Glass/alumina ratio (by wt.) | 1.1 | 0.7 |

[1]sample baked in air at 550° C. for 24 to 56 hrs to remove carbonaceous contaminants
[2]sample wet, magnetically separated
[3]USP 4032698 Formula 1 where Q is polymethyl methacrylate The rest of the organic components were dissolved in methylene chloride and filtered through a 1 to 2 μm filter. For Film E all but the copolymer and polyethylene oxide solutions were rotary evaporated to dryness before added. For Film F a stock solution of all the components to be added except for the polyethylene oxide was used.

| Film Designation | E | F |
|---|---|---|
| Dry Film | (wt. %) | |
| Glass frit | 38.76 | 30.46 |
| Alumina | 35.24 | 43.51 |
| Cobalt aluminate | 0.07 | 0.07 |
| AB Dispersant | 2.0 | 2.0 |
| Copolymer of 95.5% methylmethacrylate 4.5% ethyl acrylate, $\overline{M}_w = 50\,M$, $T_g = 96°$ C. 30.6% by wt. solution in methylene chloride | 10.53 | 10.39 |
| Polyoxyethylated trimethylol propane | 4.60 | 4.67 |
| triacrylate $\overline{M}_w = 1162$ | | |
| Dibutyl phthalate | 3.75 | 3.80 |
| Santicizer[3] 261 Alkyl benzyl phthalate (Monsanto) | 3.80 | 3.84 |
| Michler's ketone | 0.05 | 0.04 |
| Benzophenone | 0.75 | 0.78 |
| di-t-butylnitrosomethane dimer | 0.10 | 0.10 |
| Ionol[5] | 0.20 | 0.19 |
| Polox[6] WSRN 3000 polyethylene oxide 1.84% by wt. solution in methylene chloride | 0.15 | 0.15 |

For Film F an aliquot of a stock solution was used having the following composition:

| | g |
|---|---|
| Copolymer in Film E | 216.0 |
| Polyoxyethylated trimethylol propane triacrylate $M_w = 1162$ | 97.1 |
| Dibutyl phthalate | 78.9 |
| Santicizer[3] 261 | 80.0 |
| Michler's ketone | 0.89 |
| Benzophenone | 16.07 |
| di-t-butylnitrosomethane dimer | 2.14 |
| Ionol[5] | 3.93 |
| Methylene chloride | 800 |

The mill base for Film E was jar rolled in a 2.3 gal (8.81) mill jar containing 19.55 lbs. (8.87 kg) burundum cylinders (0.5 in, 1.27 cm) for 16 hrs. at 48 revolutions per minute. The mill base for Film F was jar rolled for 16 hrs. at 80 ft. (24.4 m) per minute in a 237 ml mill jar containing 242 g of 0.5 in (1.27 cm) burundum cylinders).

The dispersions were mechanically stirred with a stream of nitrogen over the container to remove excess methylene chloride to obtain a viscosity of 700 to 900 cps, as determined with a Brookfield viscometer. The dispersions were filtered through 20 μm depth filters and stirred slowly overnight to remove air from the dispersion. Film E was extrusion-die coated to a thickness of 1.8 mils (0.0046 cm) and 1.5 mils (0.0038 mm) on 1 mil (0.0025 cm) silicone-treated polyethylene terephthalate and on 0.5 mil (0.0012 cm) polyethylene terephthalate. The film was dried in three 8 ft. (2.44 m) long dryer zones with the first zone at 120° F. (48.9° C.), the second zone at 140° F. (60° C.) and the third zone at 200° F. (93.3° C.). The coating speed was 25 ft. (7.62 m) per minute. The 1.8 mil (0.0046 cm) thick film on the two different support sheets were laminated together at 7.62 m/minute at 60 psi (4.2 kg/cm²) at 150° F. 65.6° C.). Film F was coated on a Talboys coater on 48S Mylar[10] [(0.48 mil (0.0012 cm) polyethylene terephthalate film] at 6 ft (1.83 cm)/min with a 2.0 mil (0.005 cm) doctor knife to give a thickness of 0.6 mil (0.0015 cm). The temperatures of zones 1 and 2 were 35° C. and 71° C., respectively.

For Example 7, Film E that was 3.6 mils (0.0091 cm) thick was laminated at 1 ft/min with a hot roll laminator to a fired 2 in×2 in (5.08 cm×5.08 cm) copper conductor layer at 105° C. which was prepared from a copper film as described in U.S. patent application Ser. No. 685,028 filed 12/21/84, U.S. Pat. No. 4,598,037. The parts were exposed 40 sec with an HTG[7] UV source and developed 8–10 sec in a spin developer with chlorothene. The parts were fired at a peak temperature of 950° C. over a two hour cycle. The fired dielectric contained 27±7 blisters per part. This control indicates the propensity of the single composition to give blisters when fired over copper.

For Example 8, Film F was laminated to two layers of 1.5 mil thick Film E all of which were hot roll laminated together at 105° C. at 1 ft/min. The coversheet attached to Film F was removed and this was laminated to fired copper parts as described above. When this three layer composite was fired as the two layer composite of the same composition, only 0.3 blisters per part were obtained, indicating the utility of the thin, porous bottom layer.

EXAMPLE 9

This example demonstrates excellent hermeticity of 50 μm fired dielectric comprised of two top layers of the same compositions over a thin, porous bottom layer in accordance with the invention.

TABLE 3

| Composition of Dielectric Film | | |
|---|---|---|
| Film Designation | G | H |
| Mill Base | (g) | |
| Glass frit of Film E | 62.5 | 51.47 |
| Alumina of Film E, but not baked at 550° C. | 62.5 | 73.53 |
| Cobalt aluminate | 0.12 | 0.12 |
| AB Dispersant of Film E 23.52% in 3.7 to 1 methylene chloride/toluene | 14.37 | 14.37 |
| Methylene chloride | 69.0 | 69.0 |
| The dispersion was milled and filtered as Film F. | | |
| Dry Film | (wt. %) | |
| Glass frit | 37.00 | 30.47 |
| Alumina | 37.00 | 43.53 |
| Cobalt aluminate | 0.07 | 0.07 |
| AB Dispersant | 2.0 | 2.0 |
| Copolymer of Films E and F 30.04 wt. % in methylene chloride | 10.45 | 10.45 |
| Polyoxyethylated trimethylol_propane triacrylate $M_w = 1162$ | 3.06 | 3.06 |
| Dibutyl phthalate | 4.62 | 4.62 |
| Alkyl benzyl phthalate of Film E | 4.62 | 4.62 |
| Michler's ketone | 0.04 | 0.04 |
| Benzophenone | 0.76 | 0.76 |
| di-t-butylnitrosomethane dimer | 0.04 | 0.04 |
| Mill Base | (g) | |
| Ionol[5] | 0.19 | 0.19 |
| Polox[6] WSRN 3000 | 0.15 | 0.15 |

Dispersions G and H were coated on a Talboys coater as Film F but with G coated to a dry thickness of 1.5 mils (0.0038 cm) with a 4.5 mil knife on 1 mil (0.0025 cm) polyethylene terephthalate. Two layers of G were laminated together after removal of the polyethylene coversheets. A layer of H was laminated to this composite after removal of the polyethylene coversheet of H and one of the polyethylene terephthalate coversheets of G. The laminations were done with a hot roll laminator at 105° C. at 1 ft (30.5 cm)/min. The three layer film was vacuum laminated at 105° C. with a Du Pont Vacrel[9] SMVL-100 vacuum laminator after a 45 sec draw-down to preheated parts that were previously cleaned in an ultrasonic bath containing methylene chloride. The parts contained a fired screen printed conductor pattern of Du Pont thick film 9924 copper paste. The parts were exposed 60 sec with an HTG[7] source at 16 mW/cm$^2$ and spin developed for 9 sec in chlorothene. After a 15 min bake-out in a 75° C. forced draft oven the parts were fired at 1.7 in (4.3 cm)/min with a peak temperature of 950° C. The parts were tested in the EMR (Electro Migration Resistance) test to determine the hermeticity of the dielectric over the copper pattern. A leakage current of 4.4±0.7 μm/cm$^2$ was obtained with a 10 volt DC current used in the test. None of the parts had any visible leaks with examination under a microscope when the dielectric surface was covered with 1N sodium chloride solution and a 9 v battery connected to the tab of the underlying copper layer and to the wet dielectric surface. Minor surface defects of 0.1/cm$^2$ were obtained with an average size of 0.5 mil but none caused any leaks to the copper layer.

EXAMPLE 10

This example shows low leakage current, high insulation resistance and high breakdown voltage for two mil thick fired dielectric containing a porous bottom layer.

TABLE 4

| Preparation of Dielectric Film | | |
|---|---|---|
| Film Designation | I | J |
| Mill Base | (g) | |
| Glass frit of Film E | 62.50 | 51.47 |
| Alumina of Film G | — | 73.53 |
| Alumina C | 62.50 | — |
| Cobalt aluminate | 0.12 | 0.12 |
| AB Dispersant of Film E | | |
| 23.5% in 3.7 to 1 methylene chloride/toluene | 14.38 | — |
| 59.04 wt. % in toluene | — | 5.72 |
| Methylene chloride | 69.0 | 80.0 |

The dispersions were milled and filtered as Film F. Aliquots of 1–2 μm filtered stock solution of the same composition as in Film F were used. For I a 1.98 wt. % solids solution of Polyox[6] WSRN 3000 in methylene chlorie was used and for J a 2.38 wt. % solids solution was used. Both Polyox[6] solutions were prefiltered through 1–2 μm filters.

| Film Designation | I | J |
|---|---|---|
| Dry Film | (wt. %) | |
| Glass frit | 37.00 | 30.46 |
| Alumina | 37.00 | 43.51 |
| Cobalt aluminate | 0.07 | 0.07 |
| AB Dispersant | 2.00 | 2.00 |
| Copolymer of Film E and and Film F | 10.38 | 10.39 |
| Polyoxyethylated trimethylol_propane triacrylate $M_w = 1162$ | 4.66 | 4.67 |
| Dibutyl phthalate | 3.79 | 3.79 |
| Alkyl benzyl phthalate of Film E | 3.84 | 3.85 |
| Michler's ketone | 0.04 | 0.04 |
| Benzophenone | 0.78 | 0.77 |
| di-t-butylnitrosomethane dimer | 0.10 | 0.10 |
| Ionol[5] | 0.19 | 0.19 |
| Polox[6] WSRN 3000 | 0.15 | 0.15 |

Parts were prepared as with Example 9. The EMR parts gave leakage currents of 11±1.8 μA/cm$^2$. Another series of EMR parts were prepared but a top copper pattern, the same as the underlying pattern was applied so that the tabs were 90° to each other. The same thick film copper paste and firing were used for this top conductor layer. The insulation resistance at 100 volts for these 50 μm parts was 4.5±0.9×10$^{12}$ ohms. The dielectric constant was 7.8±0.1. The breakdown voltage was 2300±700 volts.

EXAMPLE 11

This example shows the utility of a high glass-/alumina ratio top layer over two layers of the composition in Example 10 which improves hermeticity and gives a smoother surface.

TABLE 5

| Composition of Dielectric Film | |
|---|---|
| Film Designation | K |
| Mill Base | (g) |
| Glass frit A | 113.64 |
| Alumina of Example 9 | 11.36 |
| Cobalt aluminate | 0.12 |
| AB Dispersant of Film E 65.2 wt. % in toluene | 4.14 |
| Methylene chloride | 80.0 |
| The dispersion was milled and filtered as in Film F. | |
| Dry Film | (wt. %) |
| Glass Frit | 62.41 |
| Alumina | 8.32 |
| Cobalt aluminate | 0.07 |
| AB Dispersant | 1.53 |
| Copolymer of Films E and F | 12.04 |
| Polyoxyethylated trimethylol_propane triacrylate $M_w$ = 1162 | 5.38 |
| Dibutyl phthalate | 4.36 |
| Alkyl benzyl phthalate of Film E | 4.42 |
| Michler's ketone | 0.05 |
| Benzophenone | 0.88 |
| Di-t-butylnitrosomethane dimer | 0.12 |
| Ionol[5] | 0.22 |
| Polyox[6] WSRN 3000 | 0.20 |

The dispersion was coated with a 1.5 mil doctor knife to yield a dried film thickness of 1.2 mils. The Talboys dryer zones were 38° C. and the film was coated on a silicone treated polyethylene terephthalate coversheet. Parts were prepared as in Example 9. Film K was laminated to Film I. A third layer of Film J was laminated to the layer of Film I. The coversheet of Film J was removed and this composite film was laminated to parts, exposed, developed and fired as described in Example 9. The leakage current in the EMR test was 2.4±0.9 μA/cm$^2$. The center line average surface roughness over copper using a Dektak IIA surface analyzer was 16.8±1.0 μin (4275A) for the resultant high gloss surface. The surface roughness for Example 8 was 26.6±2.9 μin (6770A). This comparison shows the effect on surface roughness of the high glass/alumina ratio film of the composition in Table 5.

EXAMPLES 12 AND 13

The examples show that compositions L over M of Example 12 do not blister when fired over copper where as film of Example 13 does. This demonstrates that the thin, porous bottom layer is also effective in retarding blisters in dielectric that fires out to 25 μm.

TABLE 6

| Composition of Dielectric Film for Example 12 | | |
|---|---|---|
| Film Designation | L | M |
| Mill Base | (g) | |
| Glass frit A of Film K with 0.5 wt. % of Y9883 silane (Union Carbide) | 1723 | 1169.7 |
| Alumina D with 0.5 wt. % Y9883 silane (Union Carbide) | 1435.3 | 1671.7 |
| Cobalt aluminate | 2.91 | 2.6 |
| AB Dispersant of Film E 59.6 wt. % in toluene | 33.1 | 29.8 |
| Methylene chloride | 1769 | 1592 |
| Dry Film | (wt. %) | |
| Glass Frit | 41.45 | 31.29 |
| Alumina | 34.55 | 44.71 |
| Cobalt aluminate | 0.07 | 0.07 |
| AB Dispersant | 0.48 | 0.48 |
| Copolymer of Films E and F | 11.02 | 11.02 |
| Polyoxyethylated trimethylol_propane triacrylate $M_w$ = 1162 | 4.25 | 4.25 |
| Dibutyl phthalate | 3.50 | 3.50 |
| Alkyl benzyl phthalate of Film E | 3.50 | 3.50 |
| Michler's ketone | 0.04 | 0.04 |
| Benzophenone | 0.70 | 0.70 |
| Di-t-butylnitrosomethane dimer | 0.10 | 0.10 |
| Ionol[5] | 0.18 | 0.18 |
| Polyox[6] WSRN 3000 | 0.16 | 0.16 |

Both L and M dispersions were ball milled 4 hrs. at 50 revolutions per minute as Film E. Dispersion M was extrusion-die coated at 80 ft (24.4 m)/min to a dry thickness of 0.6 mil (0.0015 cm) from a dispersion viscosity of 730 centipoise on silicone treated polyethylene terephthalate. The first dryer zone was 43° C. and the third was 93° C. The second zone was at room temperature. Dispersion L was coated as M on 0.48 mil (0.0012 cm) polyethylene terephthalate at a dry film thickness of 1.2 mils (0.0030 cm) with the same drying temperature in the first zone as for Film M but at 104° C. in the third zone. The films were laminated together at 65.6° C. at the coating speed of 80 ft (24.4 m)/min at 60 psi (4.2 kg/cm$^2$). The composite film was laminated with M underlying, exposed 20 sec and developed and fired as Example 7 to yield fired dielectric with 0.1 blisters per cm$^2$ and a leakage current of 26±14 μA/cm$^2$. The dielectric thickness of 25 μm is more prone to dirt and copper related defects than 50 μm dielectric of previous examples. The importance of the thin porous bottom layer is evident with EMR parts prepared entirely with Film N for Example 13. The fired parts had 2.4 blisters/cm$^2$ and a leakage current in the EMR test of 316 μA/cm$^2$.

TABLE 7

| Preparation of Dielectric Film for Example 13 | |
|---|---|
| Film Designation | N |
| Mill Base | (g) |
| Glass frit C with 0.5 wt. % of Y9883 silane (Union Carbide) | 1709.4 |
| Alumina D with 0.5 wt. % Y9883 silane (Union Carbide) | 1554 |
| Cobalt aluminate | 3.0 |
| AB Dispersant of Film E 51.25 wt. % solids in toluene | 39.9 |
| Methylene chloride | 1827 |
| Dry Film | (wt. %) |
| Glass Frit | 39.81 |
| Alumina | 36.19 |
| Cobalt aluminate | 0.07 |
| AB Dispersant | 0.48 |

TABLE 7-continued

Preparation of Dielectric Film for Example 13

| Film Designation | N |
|---|---|
| Copolymer of Films E and F | 11.00 |
| Polyoxyethylated trimethylol_propane triacrylate $M_w = 1162$ | 4.25 |
| Dibutyl phthalate | 3.50 |
| Alkyl benzyl phthalate | 3.50 |
| Michler's ketone | 0.04 |
| Benzophenone | 0.70 |
| Di-t-butylnitrosomethane dimer | 0.10 |
| Ionol[5] | 0.18 |
| Polyox[6] WSRN 3000 | 0.16 |

The dispersion was prepared as Film E. The dispersion viscosity was 730 cps before coating and the wt % solids was 67.9%. The film was coated as Film E to a dry thickness of 1.8 mils on 1 mil (0.0025 cm) polyethylene terephthalate base.

EXAMPLE 14

This example shows that hermetic 15 μm fired dielectric can be obtained with a two layer dielectric film containing a high glass/alumina ratio top layer or an all glass top layer (with no alumina) and a thin porous bottom layer.

TABLE 8

Composition Of Dielectric Film

| Film Designation | O | P | Q |
|---|---|---|---|
| Mill Base | (g) | | |
| Glass frit of Film E but not 550° C. baked | 113.64 | 51.47 | 125 |
| Alumina E Showa AL-45-A | 11.36 | — | — |
| Alumina of Film F but 550° C. baked | — | 73.53 | — |
| Cobalt aluminate | 0.12 | 0.12 | 0.12 |
| AB Dispersant of Film E 63.5 wt. % of solids in toluene | 5.32 | 5.32 | 5.32 |
| Methylene chloride | 68.1 | 68.1 | 68.1 |
| Dry Film | (wt. %) | | |
| Glass frit | 63.64 | 28.82 | 70.00 |
| Alumina | 6.36 | 41.18 | — |
| Cobalt aluminate | 0.07 | 0.07 | 0.07 |
| AB Dispersant | 1.89 | 1.89 | 1.89 |
| Copolymer of Films E and F | 12.24 | 12.24 | 12.24 |
| Polyoxyethylated trimethylol_propane triacrylate $M_w = 1162$ | 3.59 | 3.59 | 3.59 |
| Dibutyl phthalate | 5.41 | 5.41 | 5.41 |
| Alkyl benzyl phthalate | 5.41 | 5.41 | 5.41 |
| Michler's ketone | 0.05 | 0.05 | 0.05 |
| Benzophenone | 0.89 | 0.89 | 0.89 |
| Di-t-butylnitrosomethane dimer | 0.05 | 0.05 | 0.05 |
| Ionol[5] | 0.22 | 0.22 | 0.22 |
| Polyox[6] WSRN 3000 | 0.17 | 0.17 | 0.17 |

For Films O, P, and Q, aliquots of 1-2 μm filtered stock solution was used having the following composition:

| | (g) |
|---|---|
| Copolymer of Film E | 216 |
| Dibutyl phthalate | 95.48 |
| Alkyl benzyl phthalate | 95.48 |
| Polyoxyethylated trimethylol_propane triacrylate $M_w = 1162$ | 63.25 |
| Michler's ketone | 0.83 |
| Benzophenone | 15.72 |
| Ionol[5] | 3.92 |
| Di-t-butylnitrosomethane dimer | 0.83 |
| Polyox[6] WSRN 3000 | 3.10 |
| Methylene chloride | 852 |

The dispersions were prepared as Film F and coated as Film F with Film O coated on 0.48 mil (0.0012 cm) polyethylene terephthalate with a 1 mil (0.0025 cm) knife to a dry film thickness of 0.5 mil (0.0012 cm). Film P was coated on 1 mil (0.0025 cm) polyethylene terephthalate to a dry film thickness of 0.6 mil (0.0015 cm) with a 2.0 mil (0.005 cm) doctor knife. Film O was hot roll laminated to Film P at 105° C. at 1 ft (30.5 cm)/min and the coversheet of Film P removed and the composite film vacuum laminated to fired 9924 thick film copper EMR patterns as in Example 9. The parts were exposed 60 sec and developed 8-10 sec and fired as Example 9 to give 2 parts with a leakage current in the EMR test of an average of 2.5 μA/cm² and one part that had a leakage current of 161 μA/cm² due to defects that are more prevalent in thinner dielectric as described in Example 12. The surface roughness over copper as determined in Example 11 was 21.6±2.4μ in (5,500 Å).

EXAMPLE 15

Film Q was coated as Film O but to a dry thickness of 0.75 mil (0.0019 cm). Film Q was laminated to Film P and exposed, developed and fired as described for Example 14. The leakage current was 6.6 μA/cm² for one part but another part with visible defects had a leakage current of 94 μA/cm². This example shows that a top layer containing no alumina can yield hermetic dielectric but the parts are susceptible to defects resulting from dirt contamination in the layers.

EXAMPLE 16

A bottom layer containing a higher melting glass frit, F2860 with a $T_g$ of 655° C. compared to 590° C. for the glass frit of Film E and a softening point of 720° C. compared to 660° C. for the glass frit of Film E can be used as a thin porous bottom layer to retard blisters even though the volume glass/alumina ratio is higher in the bottom layer than in the top layer. In the previous examples the bottom porous layer contained lower volume glass/alumina ratios than the top layer.

TABLE 9

Composition of Dielectric Film

| Dispersion Designation | R1 | R2 |
|---|---|---|
| Mill Base | (g) | |
| Glass frit D | 125 | — |
| Alumina of Film O | — | 125 |
| Cobalt aluminate | 0.12 | 0.12 |
| AB Dispersant of Film E 24.4 wt. % in 3.5:1 methylene chloride:toluene | 13.83 | 13.83 |
| Methylene chloride | 69.5 | 69.5 |

R1 and R2 were milled as Film F. Aliquots of each were mixed to achieve a 1.3 glass/alumina weight ratio. 56.15 g of R1 at 59.59 wt % solids was mixed with 40.44 g of R2 at 63.65 wt % solids. 49.2 g of a stock solution prepared as for Film F at 37.68 wt % solids was used. The dispersion was coated as Film F with a 1 mil (0.0025 cm) knife to obtain a dry thickness of 0.6 mil (0.0015 cm) on 1 mil (0.0025 cm) polyethylene terephthalate.

TABLE 9-continued

Composition of Dielectric Film

| Film Designation | R |
|---|---|
| Dry Film | (wt. %) |
| Glass Frit | 41.81 |
| Alumina | 32.16 |
| Cobalt aluminate | 0.07 |
| AB Dispersant | 2.0 |
| Copolymer of Films E and F | 10.39 |
| Polyoxyethylated trimethylol propane triacrylate $M_w$ = 1162 | 4.67 |
| Dibutyl phthalate | 3.79 |
| Alkyl benzyl phthalate of Example 7 | 3.85 |
| Michler's ketone | 0.04 |
| Benzophenone | 0.77 |
| Di-t-butylnitrosomethane dimer | 0.10 |
| Ionol[5] | 0.19 |
| Polyox[6] WSRN 3000 | 0.15 |

The coated film was laminated to two 1.5 mil (0.0038 cm) thick layers of Film I of Example 10, all laminated together as described in Example 9. The composite film was vacuum laminated to EMR test patterns as in Example 9 with R underlying. The parts were exposed, developed and fired as Example 9 to give fired dielectric with no blisters. When the two layers of Film I of Example 10 are fired without the thin, porous bottom layer, over the copper EMR patterns, 2.1 blisters/cm$^2$ occur.

EXAMPLE 17

This example shows that the composition of Example 9 can be used with screen printed copper to prepare multilayers without blisters occurring in buried layers with multiple refires. A structure was prepared of a screen printed 9924 copper layer that was fired at 900° C. over an alumina substrate. To this, a film of Example 9 was laminated, exposed, developed and fired as described in Example 9. A second screen printed copper layer was applied as the first layer and this was fired at 900° C. Three more dielectric layers were applied on top with the same process conditions as for the first dielectric layer. Two additional fringes at 900° C. followed each dielectric fire. This was done to correspond to firing of a via fill and an overlying copper layer even though these materials were not applied. With this procedure the second fired copper layer was refired nine times. No blisters occurred in the buried layers of this multilayer.

EXAMPLE 18

A multilayer was prepared as in Example 17 but with two 1.4 mil thick pieces of Film I of Example 10 as the dielectric. Since this composition does not contain a porous bottom layer, large blisters appearing as delaminations occurred with firing of the second dielectric layer. This example indicates that blisters in buried copper layers occur with multiple refires when glassy films such as Film I of Example 10 are used without a porous bottom layer.

(1) Trademark of Ferro Corporation, Cleveland, OH for glass frit.
(2) Trademark of Sartomer Co., West Chester, PA, for acrylate monomers.
(3) Trademark of Monsanto Industrial Chemicals Co., St. Louis, MO for plasticizers.
(4) Trademark of Ciba-Geigy Corp., Yardsley, NY for curing agents activated by ultraviolet light.
(5) Trademark of Shell Chemical Co., Houston, TX for hindered phenolic antioxidants.
(6) Trademark of Union Carbide Corp., Morristown, NJ for water-soluble ethylene oxide polymer resins.
(7) The Hybrid Technology Group Inc., San Jose, CA.
(8) Trademark of E. I. du Pont de Nemours and Company, Inc., for acrylic resins.
(9) Trademark of E. I. du Pont de Nemours and Company, Inc., for dry film solder mask.
(10) Trademark of E. I. du Pont de Nemours and Company, Inc., for polyethylene terephthalate film.

We claim:

1. A method for inhibiting the formation of blisters during the firing of intermediate layers of fired multilayer electronic components comprising the sequential steps of:
   (1) applying to a substrate a first layer of finely divided particles of dielectric solids and glass dispersed in organic medium;
   (2) applying to the first dispersion layer a second layer comprising finely divided particles of glass dispersed in organic medium and
   (3) firing the layers to effect volatilization of the organic medium therefrom, liquid phase sintering of the glass components and densification of both layers, the softening point of the glass, the particle size of the glass and the ratio of glass to dielectric solids in both layers being adjusted in such manner that when the layers are fired, the sintering of the glass in the layers is such that upon completion of firing both layers, the first layer is porous and the second layer is nonporous, as measured by the Ink Adsorption Test.

2. The method of claim 1 in which the second layer also contains finely divided particles of dielectric solids.

3. The method of claim 1 in which at least one intermediate dielectric layer of finely divided particles of glass dispersed in organic medium is applied to the first layer, the intermediate layer upon firing being either porous or nonporous as measured by the Ink Adsorption Test.

4. The method of claim 1 in which the two dispersion layers are co-fired.

5. The method of claim 1 in which the two dispersion layers are fired sequentially.

6. The method of claim 1 in which the dispersions are in the form of pastes and are applied by screen printing.

7. The method of claim 1 in which the dispersions are in the form of solid films and are applied by lamination.

8. The method of claim 1 in which the substrate is electrically insulative.

9. The method of claim 1 in which the substrate is comprised of an electrically conductive layer supported on an electrically insulative substrate.

* * * * *